United States Patent [19]

Narahara

[11] Patent Number: 5,469,090
[45] Date of Patent: Nov. 21, 1995

[54] TRANSISTOR CIRCUIT FOR HOLDING PEAK/BOTTOM LEVEL OF SIGNAL

[75] Inventor: Tetsuya Narahara, Tokyo, Japan

[73] Assignee: NEC Corporation, Tokyo, Japan

[21] Appl. No.: 101,731

[22] Filed: Aug. 4, 1993

[30] Foreign Application Priority Data

Aug. 4, 1992 [JP] Japan ................................. 4-207684

[51] Int. Cl.⁶ ........................... G01R 19/00; H03K 5/153
[52] U.S. Cl. ................................ 327/58; 327/94; 327/62
[58] Field of Search .................................. 307/351, 352, 307/353, 360, 361, 362, 246, 603; 327/58–62, 91–96

[56] References Cited

U.S. PATENT DOCUMENTS

| | | | |
|---|---|---|---|
| 3,694,748 | 9/1972 | Hekimian | 307/351 |
| 4,987,323 | 1/1991 | Fujita | 307/351 |
| 5,038,055 | 8/1991 | Kinoshita | 307/351 |
| 5,120,995 | 6/1992 | Abdi | 307/351 |
| 5,254,881 | 10/1993 | Leonowich | 307/353 |
| 5,315,168 | 5/1994 | Norton, Jr. | 327/58 |

*Primary Examiner*—Toan Tran
*Attorney, Agent, or Firm*—Sughrue, Mion, Zinn, Macpeak & Seas

[57] ABSTRACT

A transistor circuit for detecting and holding a peak or bottom level of an input voltage includes a first transistor connected between a first power line and an output terminal, a capacitor connected between the output terminal and a second power line, a second transistor supplied with the input voltage and producing a current responsive to the input voltage, and a current mirror circuit supplied with the current from the second transistor as an input current and discharging the capacitor with an output current. The output current of the current mirror circuit is preferably designed to be smaller than a charging current to the capacitor from the first transistor.

8 Claims, 3 Drawing Sheets

FIG.4
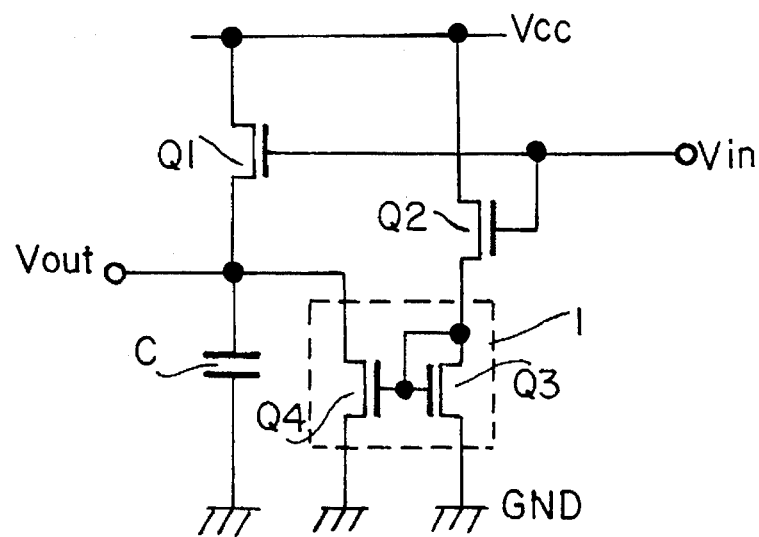
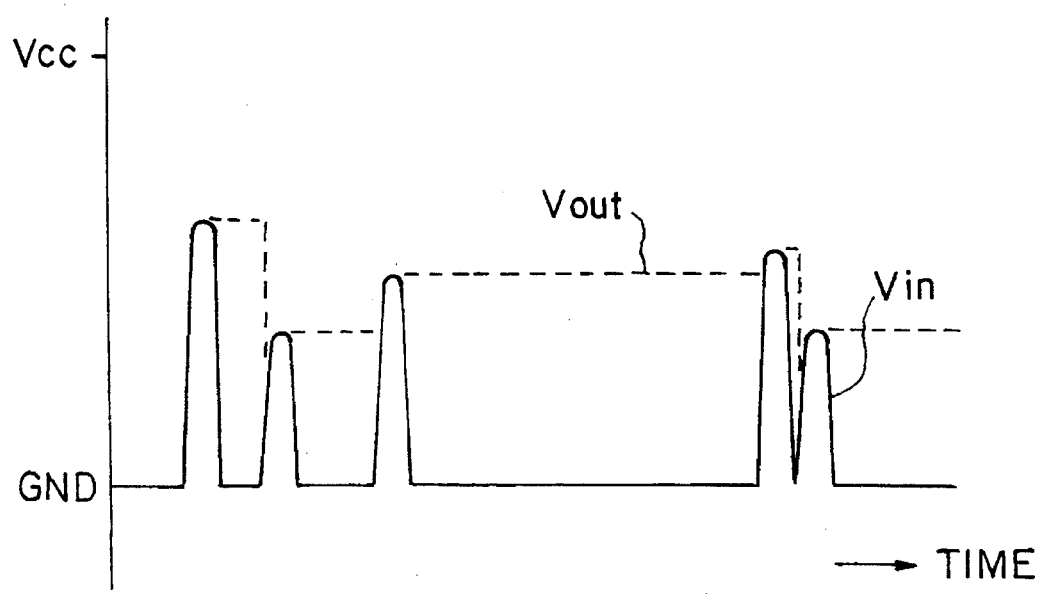
FIG.5

TRANSISTOR CIRCUIT FOR HOLDING PEAK/BOTTOM LEVEL OF SIGNAL

BACKGROUND OF THE INVENTION

The present invention relates to a transistor circuit and, more particularly, to a peak/bottom level hold circuit comprising of insulated gate field effect transistors (called hereinafter "MOS transistors").

A level hold circuit is widely employed in an electronic system to detect and hold the level or amplitude of a signal voltage. Such circuit is composed of a MOS transistor and a capacitor in general.

Referring to FIG. 1, a peak hold circuit according to a prior art includes an N-channel MOS transistor Q1 and a capacitor C connected in series between a first power line Vcc and a second, ground power line GND. A resistor R is connected in parallel to the capacitor C. The transistor Q1 has a threshold voltage of substantially zero (0 v). An input signal voltage Vin is supplied to the gate of the transistor Q1, and a voltage across the capacitor C is derived as an output voltage Vout.

In such a construction, when the input voltage Vin is larger than the output voltage Vout, the transistor Q1 is turned ON to charge the capacitor C. The output voltage Vout is thereby made large. When the input voltage Vin becomes smaller than the output voltage Vout, the transistor Q1 is turned OFF. The capacitor C is thereby discharged through the resistor R to lower the output voltage Vout. Thus, the output voltage Vout varies as shown by a doted line in FIG. 2 in response to change in level of the input voltage Vin indicated by a solid line. That is, this circuit functions as a peak level hold circuit.

However, the cycle period of the input voltage Vin is not always constant, but sometimes changes as shown in FIG. 3. In that case, a certain peak level as indicated by a reference numeral 10 or 11 in FIG. 3 is not detected by the circuit shown in FIG. 1. Moreover, when the cycle period of the input voltage Vin is prolonged, the peak level represented by the output voltage Vout is not held, but discharged to the ground level.

SUMMARY OF THE INVENTION

It is therefore an object of the present invention to provide an improved transistor circuit for holding peak/bottom level of an input voltage.

It is another object of the present invention to provide a transistor circuit for detecting and holding the peak or bottom level of a pulse-wise input voltage having an inconstant cycle period.

A transistor circuit according to the present invention comprises a first transistor supplied with an input voltage and connected between a first power supply line and an output terminal, a capacitor connected between the output terminal and a second power supply line, the first transistor charging, when turned ON, the capacitor with a first current, a second transistor supplied with the input voltage and producing a second current responsive thereto, and a current circuit coupled to the second transistor to receive the second current and discharging the capacitor with a third current relative to the second current, the third current being smaller than the first current.

BRIEF DESCRIPTION OF THE DRAWINGS

The above and other objects, features and advantages of the present invention will be more apparent from the following description taken in conjunction with the accompanying drawings, in which:

FIG. 4 is a circuit diagram illustrative of an embodiment of the present invention;

FIG. 5 is a timing chart for explaining an operation of the circuit shown in FIG. 4;

DETAILED DESCRIPTION OF THE EMBODIMENTS

Figure 1:
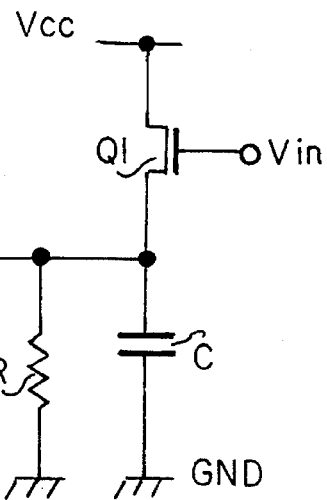
FIG. 1 is a circuit diagram illustrative of the prior art.
Figure 2:
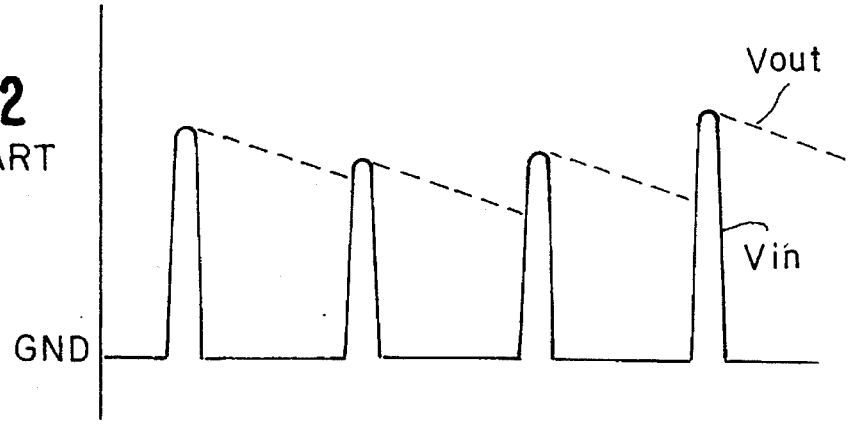
FIG. 2 is a timing chart for explaining an operation of the circuit shown in FIG. 1.
Figure 3:
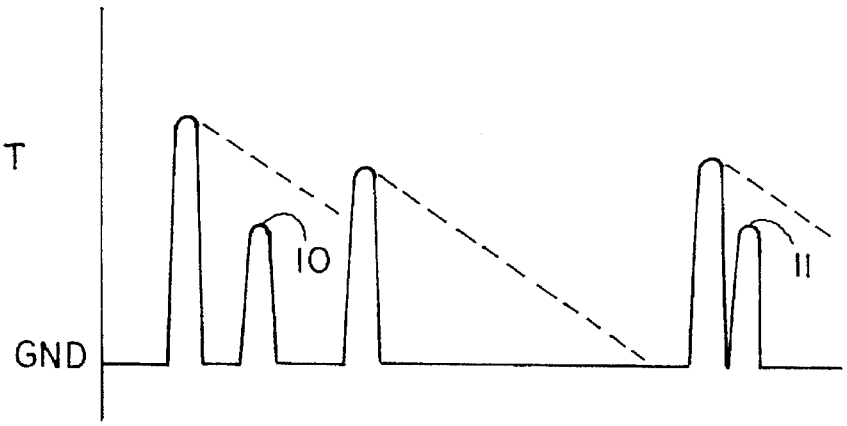
FIG. 3 is another timing chart for explaining another operation of the circuit shown in FIG. 1.

Referring now to FIG. 4, a transistor circuit according to an embodiment of the present invention operates as peak level hold circuit and includes an N-channel MOS transistor Q1 supplied at its gate with an input voltage Vin. This transistor Q1 is connected in series to a capacitor C between a power supply line Vcc and a ground supply line GND. A voltage across the capacitor C is derived as an output voltage Vout.

An N-channel MOS transistor Q2 and a current mirror circuit 1 are further provided in accordance with the present invention. The transistor Q2 receives at its gate the input voltage Vin, and is connected between the power supply line Vcc and a current input node of the current mirror circuit 1 which has a current output node connected to the connection point of the transistor Q1 and the capacitor C, i.e. an output terminal. The current mirror circuit 1 is composed of an N-channel MOS transistor Q3 and an N-channel MOS transistor Q4. The gate of the transistor Q3 is connected to its drain (i.e., the current input node) and further to the gate of the transistor Q4 having its drain serving as the current output node.

In this embodiment, each of the threshold voltage of the transistors Q1–Q4 are designed to be substantially zero (0 v). The current mirror circuit 1 has a current gain designed to be 1. Accordingly, the output current derived from the circuit 1 is equal to a current flowing through the transistor Q2. If desired, another current gain can be designed for the current mirror circuit 1. However, the output current from the mirror circuit 1 is designed to be sufficiently smaller than a current flowing through the transistor Q1. For this purpose, the transistor Q1 is made with a large area to have a high conductance, as compared to the conductance of each of the transistors Q2–Q4.

In the circuit thus constructed, when the input voltage Vin is higher than the output voltage Vout, the transistor Q1 is rendered conductive to charge the capacitor with a relatively large current. As to the transistor Q2, it is in a conductive state so long as the input voltage Vin is higher than the threshold voltage thereof. Accordingly, the current mirror circuit 1 produces the current to discharge the capacitor C. However, the current from the mirror circuit 1 is very smaller than the current from the transistor Q1, and therefore, the capacitor is charged up to the peak level of the input voltage Vin to allow the output voltage Vout to represent the peak level of the input voltage Vin, as shown in FIG. 5. When the input voltage returns to the ground level from the peak level, the transistor Q1 is turned OFF. The transistor Q2 is also turned OFF. Thus, the detected peak level is held by the capacitor C as the output voltage Vout (see FIG. 5).

When the input voltage raises again, the transistor Q2 is rendered conductive. The current mirror circuit 1 thereby discharges the capacitor C to lower the output voltage Vout. At a time when the output voltage Vout thus lowered becomes equal to the input voltage Vin, the transistor Q1 is turned ON to charge the capacitor C. Thus, as shown in FIG. 5, even when the time interval between the adjacent two peaks is relatively short, each peak level is surely detected and held. Moreover, even in the case where the next peak does not appear for a relatively long time, the detected peak level continues to be held.

The input voltage often includes noise voltages. In that case, it is preferable that the threshold voltage of the transistor Q2 is made large. Accordingly, the transistor does not respond to the noise voltages. The generation of an undesired discharge current from the current mirror circuit 1 is thereby prevented. The threshold voltages of the transistors Q3 and Q4 may be higher than the ground level.

Figure 6:
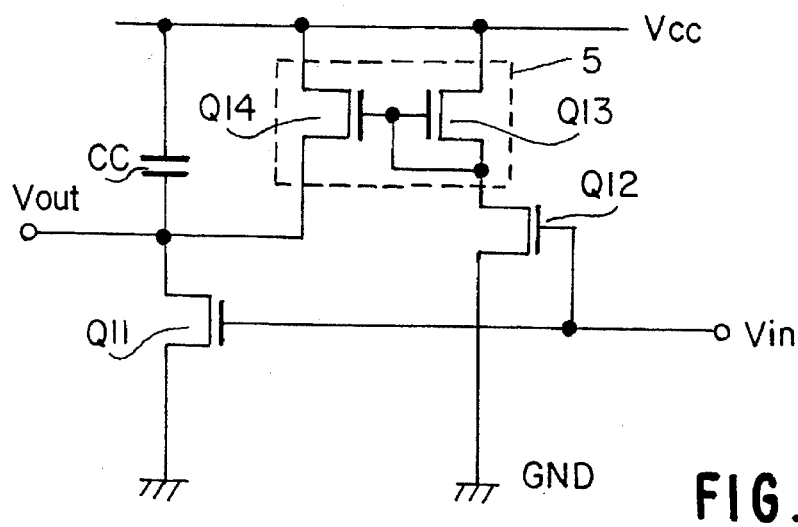
FIG. 6 is a circuit diagram illustrative of another embodiment of the present invention.
Figure 7:
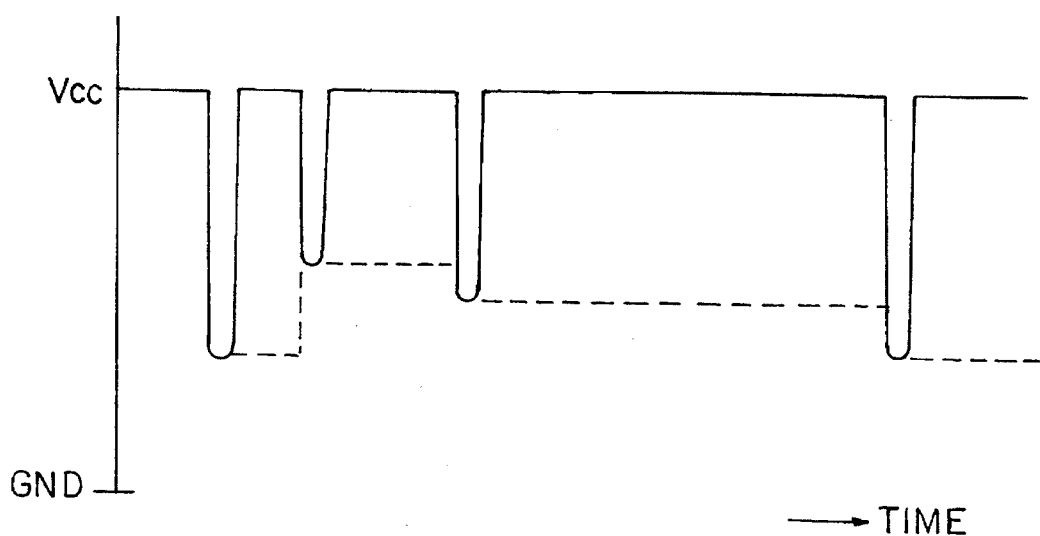
FIG. 7 is a timing chart for explaining an operation of the circuit shown in FIG. 6.

Turning to FIG. 6, a transistor circuit according to another embodiment of the present invention includes four P-channel MOS transistors Q11–Q14 and a capacitor CC which are connected as shown. The transistors Q13 and Q14 constitute a current mirror circuit 5. This circuit thus functions as a bottom level detecting and holding circuit for an input voltage Vin, as shown in FIG. 7. Since the circuit operation of this circuit is the substantially same as that of the circuit of FIG. 4, the further description thereof will be omitted.

It is apparent that the present invention is not limited to the above embodiments but may be modified and changed without departing from the scope and spirit of the invention.

What is claimed is:

1. A transistor circuit comprising
   a first transistor supplied with an input voltage and connected between a first power supply line and an output terminal,
   a capacitor connected between said output terminal and a second power supply line and producing an output voltage at said output terminal, said first transistor, when rendered conductive, charging said capacitor with a first current,
   a second transistor supplied with said input voltage and producing a second current responsive to said input voltage irrespective of whether said input voltage is larger or smaller than said output voltage, and
   a current circuit coupled to receive said second current and discharging said capacitor with a third current relative to said second current, said third current for discharging said capacitor existing concurrently with and being smaller than said first current to thereby allow said output voltage to follow said input voltage when said first transistor is rendered conductive.

2. The transistor circuit as claimed in claim 1, wherein said current circuit comprises a current mirror circuit having an input node connected to said second transistor and an output node connected to said output terminal, and being responsive to said second current supplied to said input node to produce said third current at said output node.

3. The transistor circuit as claimed in claim 2, wherein said first and second transistors have the same threshold voltage as each other.

4. The transistor circuit as claimed in claim 2, wherein said first transistor has a first threshold voltage smaller than a second threshold voltage of said second transistor.

5. A transistor circuit comprising
   a first transistor connected between a first power supply line and an output terminal and having a gate supplied with an input voltage,
   a capacitor connected between said output terminal and a second power supply line and producing an output voltage at said output terminal, said first transistor being rendered conductive to charge said capacitor with a first current when said input voltage is larger in absolute value than said output voltage,
   a second transistor connected between said first power supply line and a circuit node and having a gate supplied with said input voltage,
   a third transistor connected between said circuit node and said second power supply line and having a gate connected to said circuit node, said second transistor being rendered conductive in response to said input voltage to produce a second current irrespective of said output voltage, and
   a fourth transistor connected between said output terminal and said second power supply line and having a gate connected to the gate of said third transistor, said fourth transistor cooperating with said third transistor to constitute a current mirror circuit to produce a third current that is relative to said second current and smaller than said first current, and discharging said capacitor with said third current.

6. The transistor circuit as claimed in claim 5, wherein said first, second, third and fourth transistors have channel types equal to one another.

7. The transistor circuit as claimed in claim 6, said second transistor having a second threshold voltage larger than a first threshold voltage of said first transistor.

8. The transistor circuit as claimed in claim 6, said first transistor having a first threshold voltage substantially equal to a second threshold voltage of said second transistor.

\* \* \* \* \*